(12) United States Patent
Dean et al.

(10) Patent No.: US 7,068,192 B1
(45) Date of Patent: Jun. 27, 2006

(54) SYSTEM AND METHOD FOR ENCODING AND DECODING VARIABLE-LENGTH DATA

(75) Inventors: Jeffrey Dean, Palo Alto, CA (US); Michael Burrows, Palo Alto, CA (US); Gauthaum K. Thambidorai, Sunnyvale, CA (US); Olcan Sercinoglu, Mountain View, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 10/917,745

(22) Filed: Aug. 13, 2004

(51) Int. Cl.
*H03M 7/40* (2006.01)
(52) U.S. Cl. ........................................ 341/67; 707/100
(58) Field of Classification Search ................ 341/50, 341/106, 67, 65; 707/100, 101
See application file for complete search history.

(56) References Cited

U.S. PATENT DOCUMENTS

| | | | | |
|---|---|---|---|---|
| 5,548,751 A | * | 8/1996 | Ryu et al. | 707/102 |
| 5,758,360 A | * | 5/1998 | Zbikowski et al. | 707/205 |
| 5,946,716 A | * | 8/1999 | Karp et al. | 711/207 |
| 6,553,457 B1 | * | 4/2003 | Wilkins et al. | 711/113 |
| 6,646,577 B1 | * | 11/2003 | Acharya et al. | 341/67 |
| 6,728,722 B1 | * | 4/2004 | Shaylor | 707/101 |
| 6,832,294 B1 | * | 12/2004 | Wicki et al. | 711/128 |

* cited by examiner

*Primary Examiner*—Peguy JeanPierre
(74) *Attorney, Agent, or Firm*—Morgan, Lewis & Bockius LLP

(57) ABSTRACT

A system and method for encoding and decoding variable-length data includes storing data values in a data structure including a data field and a tag field. The data field includes one or more variable-length data subfields capable of storing variable-length data (e.g., 1 to N bytes of data). In some embodiments, the data subfields and the tag field of the data structure each start on a byte boundary which simplifies decoding. The tag field includes one or more tag subfields, each corresponding to the one or more data subfields. Each tag subfield includes one or more tag bits which indicate the length of the data stored in the corresponding data subfield. Unpacking or decompressing data values from the data structure can be achieved by using a look-up table of offsets and masks, thus reducing the number of bit operations needed to unpack data values from the data structure.

27 Claims, 8 Drawing Sheets

Offset/Mask Table (LUT) 500

| Tag | Offset Int #1 | Offset Int #2 | Offset Int #3 | Offset Int #4 | Mask Int #1 | Mask Int #2 | Mask Int #3 | Mask Int #4 | Offset Next |
|---|---|---|---|---|---|---|---|---|---|
| 0 | 1 | 2 | 3 | 4 | 000000ff | 000000ff | 000000ff | 000000ff | 5 |
| 1 | 1 | 3 | 4 | 5 | 0000ffff | 000000ff | 000000ff | 000000ff | 6 |
| 2 | 1 | 4 | 5 | 6 | 00ffffff | 0000ffff | 000000ff | 000000ff | 7 |
| 3 | 1 | 5 | 6 | 7 | ffffffff | 00ffffff | 0000ffff | 000000ff | 8 |
| 4 | 1 | 2 | 4 | 5 | 0000ffff | 0000ffff | 000000ff | 000000ff | 6 |
| 5 | 1 | 3 | 5 | 6 | 0000ffff | 00ffffff | 0000ffff | 000000ff | 7 |
| 6 | 1 | 4 | 6 | 7 | 00ffffff | 0000ffff | 0000ffff | 000000ff | 8 |
| 7 | 1 | 5 | 7 | 8 | ffffffff | 00ffffff | 00ffffff | 0000ffff | 9 |
| ... | ... | ... | ... | ... | ... | ... | ... | ... | ... |
| 252 | 1 | 2 | 6 | 10 | 000000ff | ffffffff | ffffffff | ffffffff | 14 |
| 253 | 1 | 3 | 7 | 11 | 0000ffff | ffffffff | ffffffff | ffffffff | 15 |
| 254 | 1 | 4 | 8 | 12 | 00ffffff | ffffffff | ffffffff | ffffffff | 16 |
| 255 | 1 | 5 | 9 | 13 | ffffffff | ffffffff | ffffffff | ffffffff | 17 |

*Figure 5A*

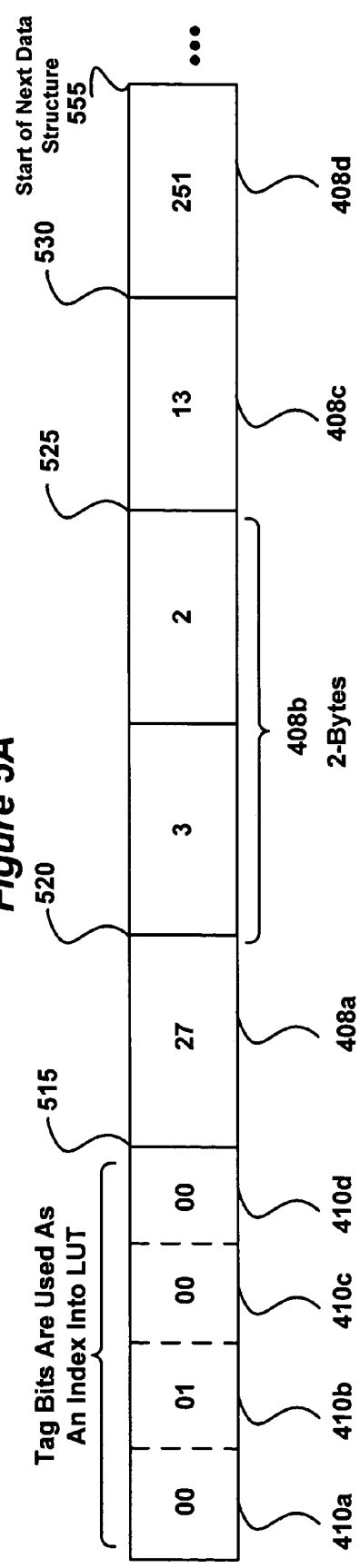

*Figure 5B*

SYSTEM AND METHOD FOR ENCODING AND DECODING VARIABLE-LENGTH DATA

RELATED APPLICATION

This application is related to U.S. patent application Ser. No. 10/917,739, filed Aug. 13, 2004, entitled "Document Compression System and Method For Use With Tokenspace Repository," which is incorporated by reference herein in its entirety.

TECHNICAL FIELD

The disclosed embodiments relate generally to data processing systems and methods, and in particular to a system and method for encoding and decoding variable-length data.

BACKGROUND

Some data processing applications (e.g., search engines) work extensively with variable-length data (e.g., variable-length integers). To conserve space and/or increase throughput, variable-length data can be encoded into a compressed format which represents the data in fewer bytes than would ordinarily be used to store the data. For example, an integer value may be associated with a 32-bit integer data type. However, if the actual value of the integer is in the range of 0 to 255, the value can be more compactly represented by 8-bits or a single byte, resulting in a savings of 24 bits or three bytes.

The encoding of variable-length data into a compressed format typically requires the storing and maintaining of additional information for use in decoding, such as data indicating the number of bits or bytes used to represent a compressed integer value. The management of such "bookkeeping" information typically requires additional overhead bits for use during decoding. For example, some conventional encoders add a "continuation bit" to each byte used to represent a compressed integer value to assist the decoder in identifying boundaries between consecutive compressed integer values. Although effective, such encoding techniques typically require several bitwise operations (e.g., Boolean, shift, branch, etc.) to unpack or decompress the integer values, which can slow down the decoding process and degrade overall system performance. Such degradation is especially problematic in applications that perform large-scale processing of compressed data, such as information retrieval systems.

Accordingly, what is needed is a system and method for efficiently encoding and decoding variable-length data.

SUMMARY OF DESCRIBED EMBODIMENTS

Data values may be stored in a variable length data structure including a data field and a tag field. The data field includes one or more data subfields, each capable of storing variable-length data (e.g., 1 to N bytes of data). In some embodiments, the data subfields and the tag field of the data structure each start on a byte boundary which simplifies decoding. The tag field includes one or more tag subfields corresponding to the one or more data subfields. Each tag subfield includes one or more tag bits which indicate the length of the data stored in the corresponding data subfield. Unpacking or decompressing data values from the data structure can be achieved by using a look-up table of offsets and masks, thus reducing the number of bit operations needed to unpack data values from the data structure.

In some embodiments, a data structure stored in a computer-readable medium includes a tag field that occupies a contiguous space in the data structure. The tag field specifies storage lengths for N data values, where N is a positive integer greater than one. The data structure further includes N data fields contiguously arranged with the tag field for storing the N values, wherein each of the N data fields has a storage length specified by the tag field.

In some embodiments, a method of decoding an encoded block of data includes decoding a tag, occupying a contiguous space, so as to identify storage lengths for N fields of the encoded block of data, where N is an integer greater than one; and reading the N fields at positions in the encoded block of data determined in accordance with the tag, wherein the encoded block of data includes a contiguously stored set of fields, including the tag and the N fields.

In some embodiments, a method of encoding a block of data includes: generating a tag, occupying a contiguous space, comprising N subfields, each subfield specifying a respective length of a respective field of N fields in a set of fields; and storing the tag and the set of fields in a block of data comprising a contiguous set of storage locations, wherein each of the N fields has a length specified by a respective subfield of the N subfields.

BRIEF DESCRIPTION OF THE DRAWINGS

FIG. 5A illustrates an embodiment of a combined offset/mask table for decoding the encoded group of integer values of FIG. 4.

FIG. 5B illustrates an embodiment of the data structure of FIG. 4 showing byte offset boundaries.

Like reference numerals refer to corresponding parts throughout the several views of the drawings.

DESCRIPTION OF EMBODIMENTS

Figure 1:
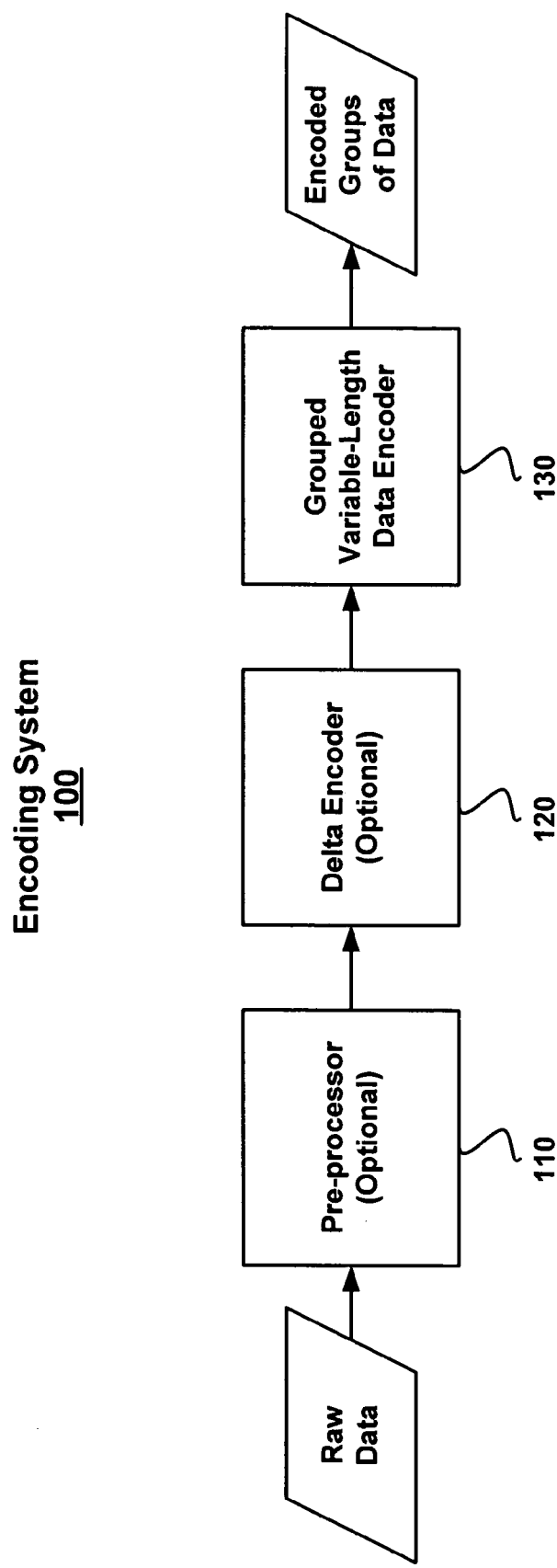
FIG. 1 is a flow diagram of an embodiment of an encoding system for encoding variable-length data.

FIG. 1 is a flow diagram of an embodiment of an encoding system 100 for encoding variable-length data. The encoding system 100 includes an optional preprocessor 110, an optional delta encoder 120 and a variable-length data encoder 130. Variable-length data can be stored as various data types including, without limitation, integers, character strings, floating-point numbers, fixed-point numbers and the like. The variable-length data includes but is not limited to text, images, graphics, audio samples and the like.

In some embodiments, raw data is received by the pre-processor 110 which orders the information for efficient encoding. For example, the pre-processor 110 may order the data into a monotonic sequence using one or more sorting algorithms. If a set of integers are sorted by value, then adjacent integers will be close in magnitude, thus enabling the delta encoder 120 to generate small valued integers for encoding. The ordered data is received by the delta encoder 120, which computes differences between adjacent pairs of the ordered data to obtain the small valued integers. The small valued integers are received by the variable-length data encoder 130, which encodes the data into a compressed format which can be efficiently decoded, as described more fully with respect FIGS. 3–7.

Figure 2:
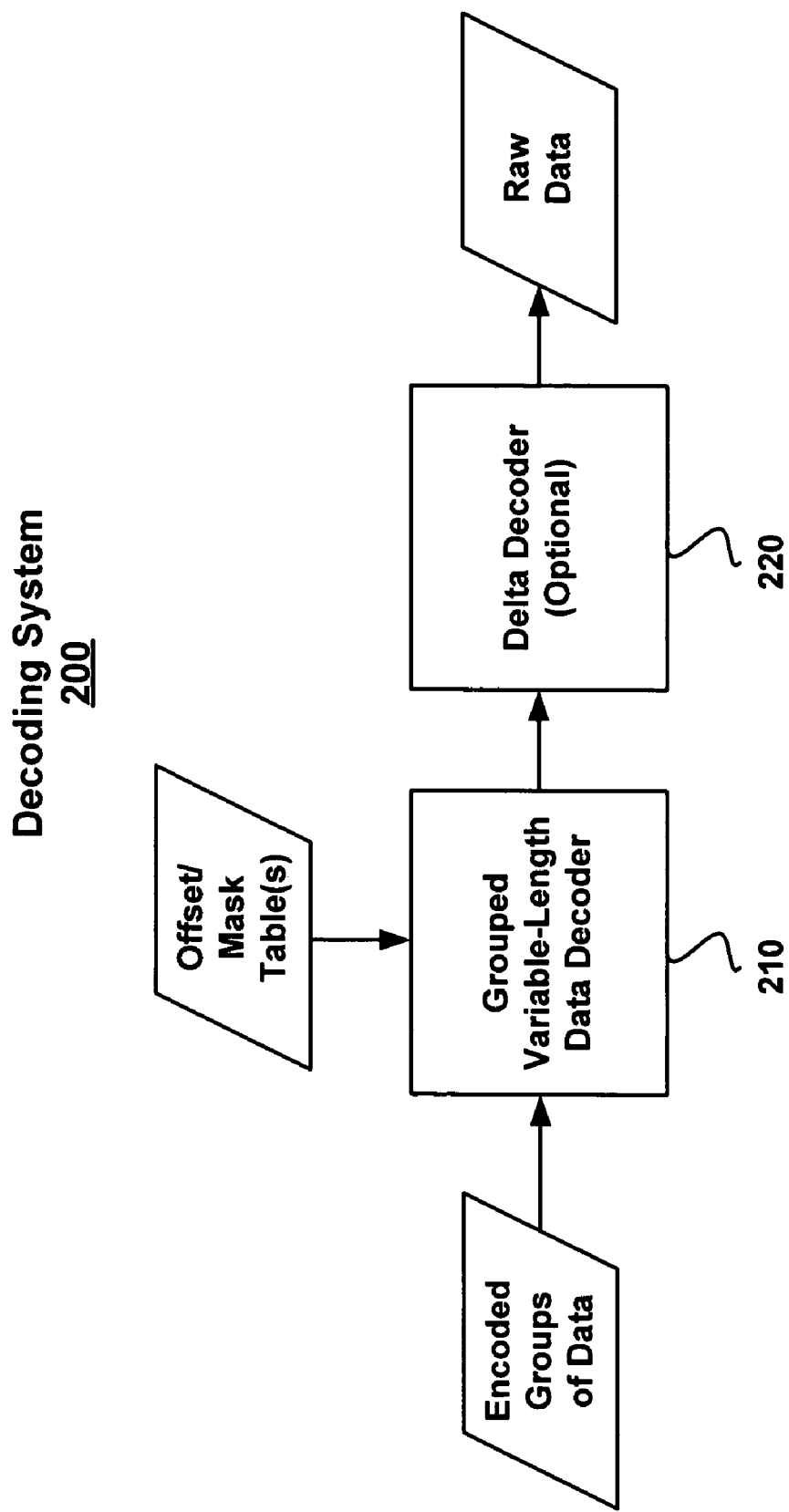
FIG. 2 is a flow diagram of an embodiment of a decoding system for decoding variable-length data.

FIG. 2 is a flow diagram of an embodiment of a decoding system 200 for decoding variable-length data. The decoding system 200 includes a variable-length data decoder 210 and an optional delta decoder 220. In some embodiments, encoded groups of data are received by the variable-length data decoder 210, which decodes the groups with the assistance of one or more offset/mask tables. The decoded data is received by the delta decoder 220, which computes running sums, thereby producing delta-decoded data, which is equivalent to the original raw data. The use of offset/mask tables in decoding group encoded variable-length integer values is described more fully with respect to FIGS. 5 and 7.

Figure 3:
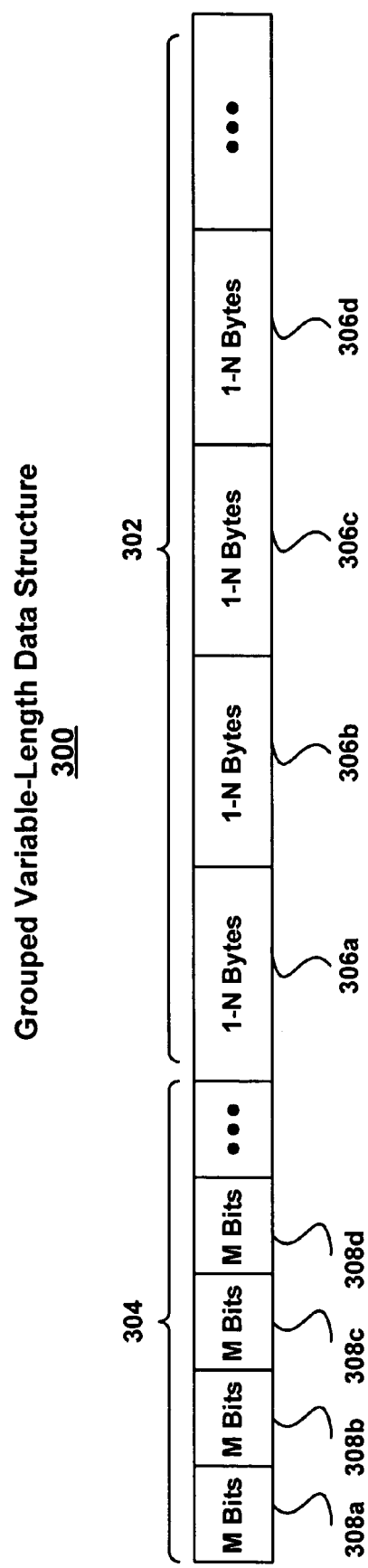
FIG. 3 illustrates an embodiment of a data structure for use in encoding variable-length data.

FIG. 3 illustrates an embodiment of a grouped variable-length data structure 300 for use in encoding variable-length data. The data structure 300 includes a variable length data field 302 and a fixed-length tag field 304. The variable-length data field 302 includes two or more variable-length data subfields 306 and the tag field 304 includes fixed-length tag subfields 308. In some embodiments, each data subfield 306 stores a variable-length data value that can range from 1 to N bytes in length. Each data subfield 306 has a corresponding fixed-length tag subfield 308 which is used to represent the actual number of bytes used in the data subfield 306. For example, the data subfield 306a corresponds to the tag subfield 308a, the data subfield 306b corresponds to the tag subfield 308b and so on. Each tag subfield 306 includes M tag bits, where $N=2^M$. Thus, if N=4, then each data subfield 306 will have a potential length of 1 to 4 bytes and the corresponding tag subfield 308 will include M=2 tag bits. Likewise, if N=8, then each data subfield 306 can potentially include 1 to 8 bytes and the corresponding tag subfield 308 will include M=3 tag bits and so on. As can be observed from these examples, the tag subfields 308 include the minimum number of tag bits needed to represent the maximum length of the corresponding data subfield 306.

In the embodiment shown in FIG. 3, the data structure 300 occupies a contiguous space, and the tag field 304 occupies a contiguous space within the data structure 300. More generally, the tag field 304 may be located anywhere within the data structure 300 or it can be stored as a separate data structure. Locating the tag field 304 at the beginning or end of a data structure 300 allows an adjacent data structure in a sequence of data structures (e.g., an encoded data stream) to be easily located and accessed using simple arithmetic operations and/or a table lookup. Storing the tag field 304 in a separate data structure also allows the tag field 304 to be processed as a separate data stream in, for example, a multi-threaded or multi-processor environment. As a separate data stream, the tag field 304 can be encoded using one or more conventional encoding schemes (e.g., run-length encoding).

Figure 7:
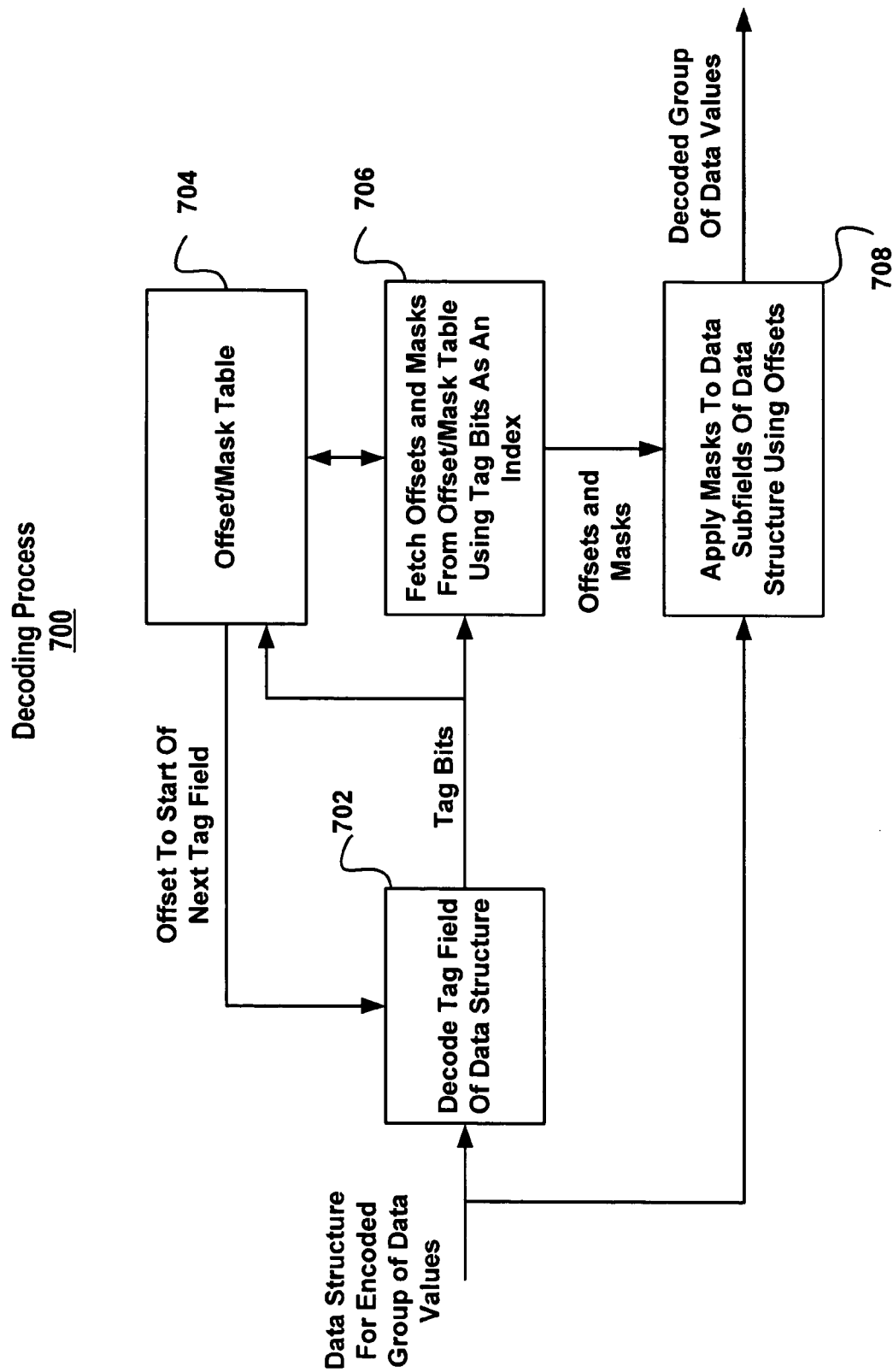
FIG. 7 is a flow diagram of an embodiment of a decoding process for decoding an encoded group of variable-length integer values.

In some embodiments, data subfields 306 of the data structure 300 and the tag field 304 each start on a byte boundary (i.e., the tag field 304 and each of the data fields 306 occupies an integer number of bytes), which greatly simplifies the decoding process, as described more fully with respect FIG. 7. It should be apparent, however, that the data structure 300 is not limited to four data subfields 306 and four tag subfields 308 and that more or fewer data subfields 306 and tag subfields 308 can be included in the data structure 300, as needed, depending upon the application. Furthermore, in some embodiments the tag field 304 may occupy an amount of space that is not an integer number of bytes, and one or more of the data fields 306 may occupy an amount of space that is not an integer number of bytes. For instance, the tag subfields 308 may specify the lengths of the data fields in units of 4-bit nibbles, or any other appropriate unit.

Figures 4A, 4B:
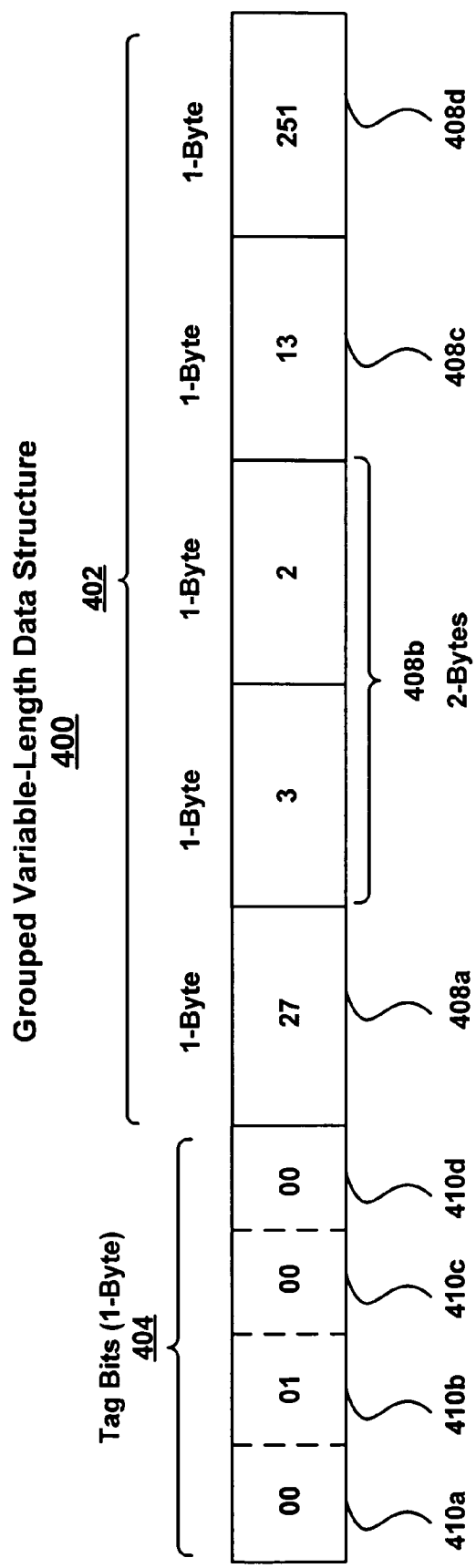
FIG. 4A illustrates an embodiment of a data structure for use in encoding a group of four 32-bit variable-length unsigned integer values.
FIG. 4B is a table illustrating tag bit pair assignments for various ranges of integer values.

FIG. 4A illustrates an example of a data structure 400 for use in encoding a group of four 32-bit variable-length unsigned integer values. An example of an application where such 32-bit unsigned integer values can be used in an inverse index for an information retrieval system, such as the system and method described in co-pending U.S. application Ser. No. 10/917,739, filed Aug. 13, 2004, entitled "Document Compression System and Method For Use With Tokenspace Repository," which is incorporated by reference herein in its entirety.

The data structure 400 includes a variable-length data field 402 and a fixed-length tag field 404. The data field 402 includes four variable-length data subfields 408 and the fixed-length tag field 404 includes four fixed-length tag subfields 410. In this particular example, three of the data subfields 408a, 408c, 408d each store a single byte of data and the fourth data subfield 408b stores two bytes of data. For illustrative purposes, each byte of data in the data structure 400 shown in FIG. 4A is represented by a decimal (base 10) equivalent value. For example, the data subfield 408d stores a byte having a decimal equivalent value of 251, data subfield 408c stores a byte having a decimal equivalent value of 13, data subfield 408b stores two-bytes having respective decimal equivalent values of 2 and 3, and data subfield 408a stores a byte having a decimal equivalent value of 27.

The tag subfields 410a, 410c and 410d, corresponding to data subfields 408a, 408c and 408d, each include the bit pair "00," indicating that each of the data subfields 408a, 408c and 408d store one byte of data. On the other hand, the tag subfield 410b, corresponding to data subfield 408b, includes the bit pair "01," indicating that the data subfield 408b is storing two bytes of data. In this particular embodiment, the tag field 404 is one byte in length. It should be apparent, however, that the tag field 404 can be one or more bytes in length depending on how may integer values will be stored in the data structure 400. For example, if eight integer values are to be stored in the data structure 400, then the tag field 404 would be two bytes in length, i.e., two bits for every integer value. It is also possible that more than two tag bits would be needed for each tag subfield 410 to cover a larger range of integer values. In such an embodiment, each tag subfield 410 could include three bits, resulting in a tag field that is three bytes long for a group of eight integer values (3 bits×8 integer values=24 bits or 3 bytes).

FIG. 4B is a table illustrating tag bit pair assignments for various ranges of integer values. Note that the data values stored in data subfields 408a, 408c and 408d, namely "27", "13," and "251," all fall within the value range 0–255 and therefore can be represented by one byte of data. The value stored in data subfield 408b, namely "515," falls in the range of 256–65,535 and therefore can be represented by two bytes of data have decimal equivalent values of "2" and "3" respectively.

FIG. 5A illustrates an embodiment of a combined offset/mask table 500 for decoding the data structure 400 of FIG. 4A. The table 500 includes 256 rows which can be indexed by tag value 510. Each row includes: 1) an offset for the first 515, second 520, third 525, and fourth 530 data subfields 408 in the data structure 400, 2) masks used for efficiently reading the first 535, second 540, third 545, and fourth 550 data subfields 408 from memory, and 3) an offset 555 to a next data structure. Note that if the tag field 404 is stored highest in memory, then analogous table entries would provide an offset 555 to an adjacent preceding data structure 400 in the sequence of contiguous data structures. In some embodiments, certain offsets are unneeded and those columns may be omitted from the table 500.

It should be apparent that the table 500 is not limited to the number of rows and/or columns shown in FIG. 5A, but can have any number of rows and columns, as needed, depending upon the number of values that are group encoded. In some embodiments, the offsets and masks are stored in separate tables or other types of data structures (e.g., lists, arrays, queues, etc.).

Referring again to the data structure 400, which has been reproduced in FIG. 5B for the reader's convenience, it can be observed that the tag field 402 is one byte long and includes tag subfields 410a, . . . ,410d, containing tag bit pairs 00, 01, 00, and 00, respectively. These tag bit pairs in turn correspond to a total data field 402 length of 5 bytes. This particular combination of bit pairs has a decimal equivalent value of "4" and therefore could be used to index row 4 of table 500, as indicated with cross-hatching. In row 4 of table 500, the offsets 515, 520, 525 and 530 to the first bytes of data stored in data subfields 408a, . . . , 408d, are 1, 2, 4, and 5 bytes, respectively (reading from left to right in FIG. 5B). The offset 555 to the next data structure is 6 bytes as expected. That is, a data structure that follows the data structure 400 would begin at byte six, given that bytes zero through five are included in the data structure 400.

Row 4 in table 500 also includes masks 000000ff, 0000ffff, 000000ff, and 000000ff in hexadecimal notation for decoding each 1–4 byte integer value into its original 32-bit integer format. In some embodiments, it may be easier to read the packed integers with an unaligned full-width read. This means that the least-significant bytes of the integer will contain the packed integer, while the other bytes will contain data from subsequent packed integers or other data structures. The number of least-significant bytes that will contain the packed integer depends on how many bytes were used to store the packed integer. In some embodiments, the mask may be used with a bitwise AND operation to throw away bytes not used to store the packed integer. For example, if an AND operation is performed between the five byte data field 402 with the mask 000000ff, only the least least-significant byte will survive the mask operation. Likewise the masks 0000ffff, 00ffffff, and ffffffff indicate that the two, three, and four least-significant bytes should be kept. Thus, since the starting positions of the data subfields 408 and tag field 404 are aligned on byte boundaries, the various bytes stored in the data subfields 408 and tag field 404 can be decoded using simple mask operations without unnecessary bit operations (e.g., bit shift operations, etc.).

Figure 6:
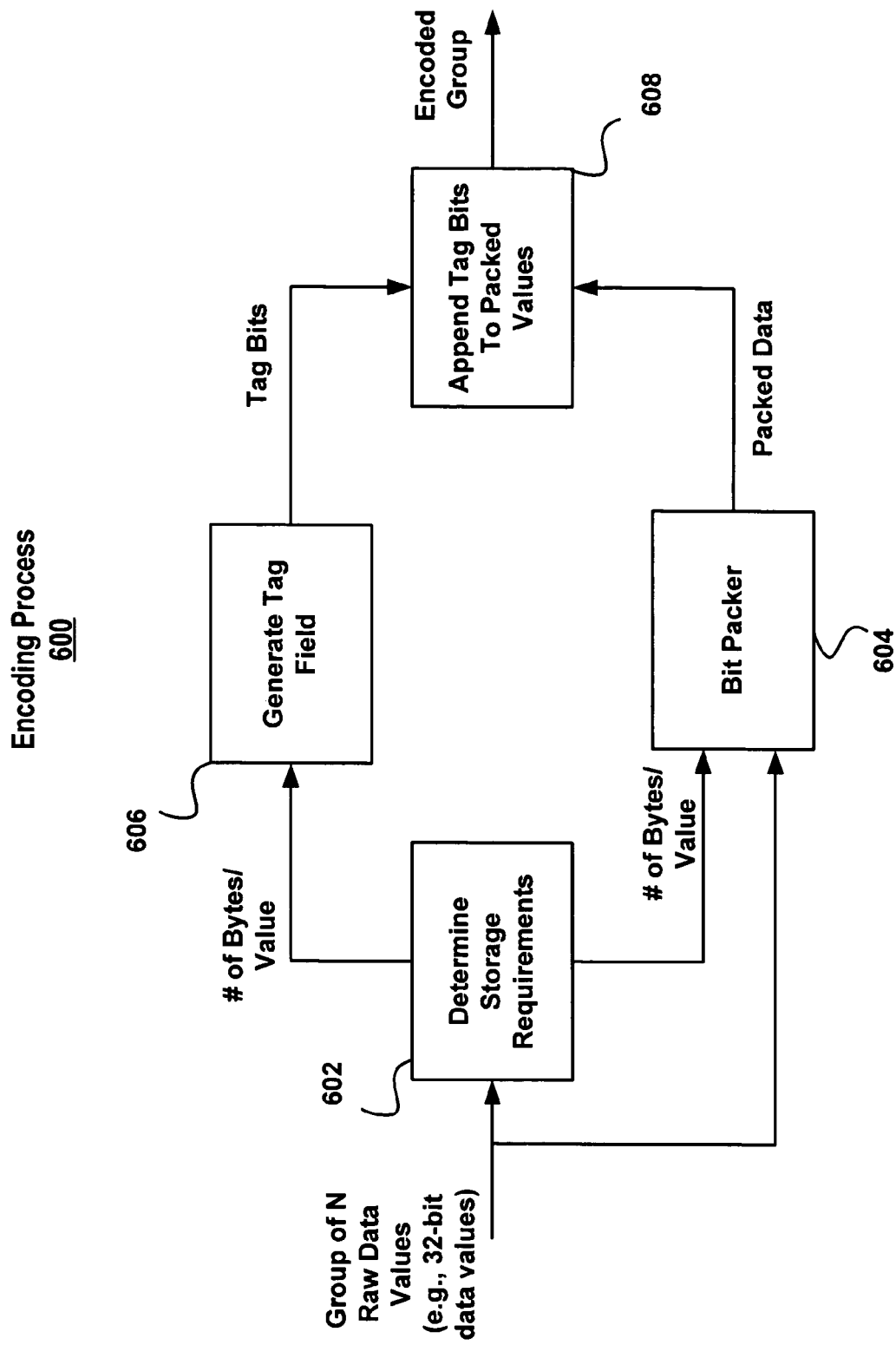
FIG. 6 is a flow diagram of an embodiment of a encoding process for encoding a group of variable-length integer values.

FIG. 6 is a flow diagram of an embodiment of a encoding process 600 for encoding grouped variable-length data values. The process 600 begins by determining the minimum storage requirements (e.g., number of bytes) for a group of N data values (602). In some embodiments, this is achieved by looking at the magnitude of each data value (e.g., integer value) and determining the minimum number of bytes required to store the data value in a data structure (e.g., data structure 400). For purposes of this explanation, the data values are treated as integers, even though they may represent other types of values, such as characters, symbols, other types of numeric values, and so on. A data value in the range of 0–255 can be represented by one byte, while a data value in the range of 256–65,535 can be represented by two bytes and so on. After the storage requirements are determined, the data values are packed into a data field (e.g., data field 402) of the data structure (604) based on the minimum number of bytes needed to store the data values determined at 602. The data values can be packed in the data field using known bit packing techniques. In addition, a tag field (e.g., tag field 404) is generated that reflects the resulting packed data field (606), using the systems and methods previously described with respect to FIGS. 3–5. After the tag field is generated, it can be appended to the data field (608). In some embodiments, the tag field is appended to one end of the data structure to simplify its decoding. In other embodiments, the tag field is stored as a separate data structure to be decoded into a separate data stream in, for example, a multi-threading or multi-processor environment.

FIG. 7 is a flow diagram of an embodiment of a decoding process 700 for decoding grouped variable-length data values, which may be integer values or other data values. A data structure (e.g., data structure 400) storing a group of N encoded data values is received by the decoding process 700 and the tag bits are decoded from the data structure (702). The tag bits are preferably located at the beginning or end of the data structure to facilitate their decoding using an offset value stored in an offset/mask table 704, together with knowledge of the tag field size (e.g., a byte). The tag bits are used to index the offset/mask table 704 and to retrieve the appropriate offsets and masks to decode the encoded data values from the data structure (706) and load them into registers or memory. The retrieved masks are then applied to the data subfields of the data structure using the offsets (708), thus resulting in a decoded group of data values.

Given an 8-bit tag field of "00000100" as shown in FIG. 4A, the appropriate byte offsets are retrieved from the offset/mask table 500 and used to extract a set of values from the data structure 400. These values may be stored in one or more registers or memory. A bitwise AND operation is performed on the extracted values and the corresponding 32-bit mask value retrieved from the offset/mask table 500, resulting in the original 32-bit data value. Thus, the original data values can be decoded from the data structure 400 using a bitwise AND operation, and without performing branch or shift operations that can degrade performance.

While the process flows described with respect to FIGS. 6 and 7 include multiple steps, it should be apparent that the steps are not limited to any particular order, and, moreover, the process flow can be executed using more or fewer steps, including executing multiple steps simultaneously.

Figure 8:
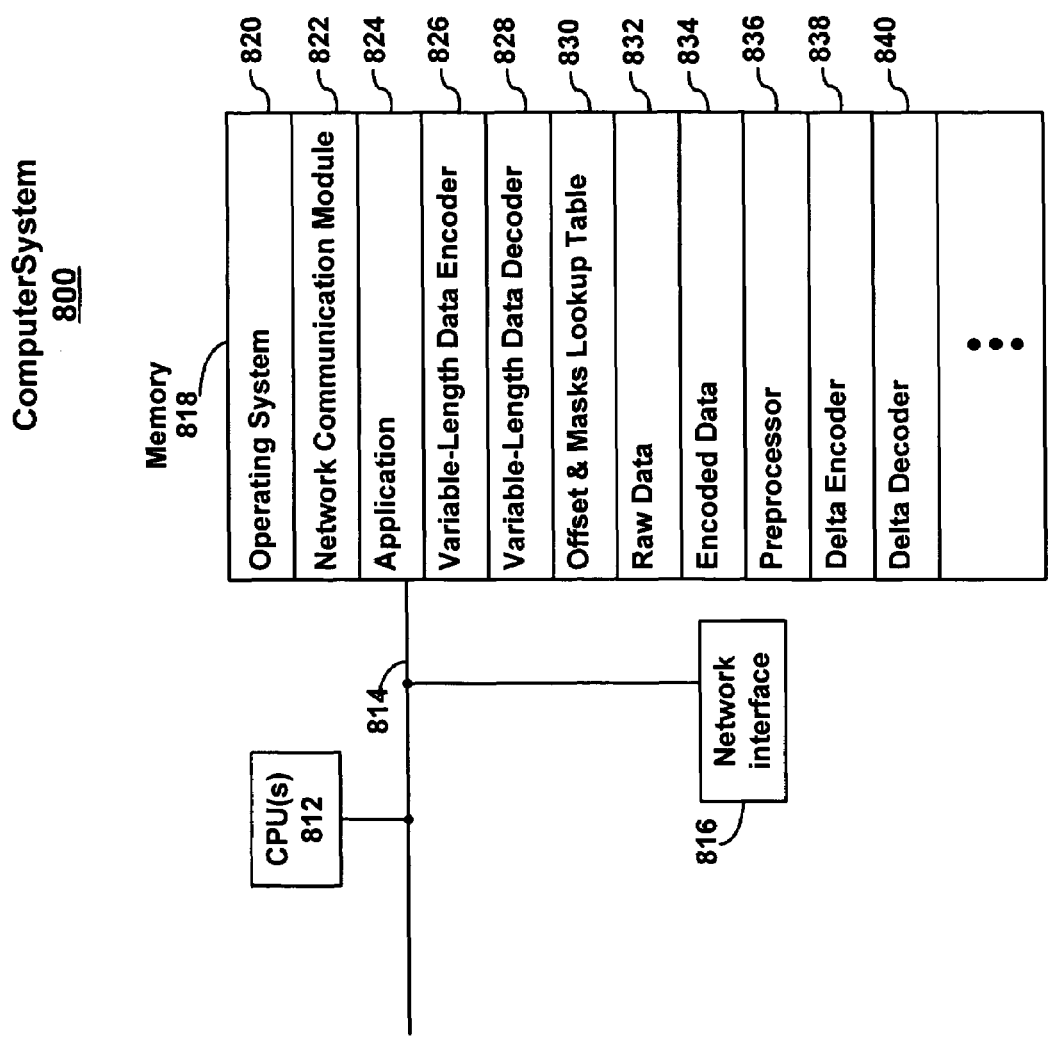
FIG. 8 is a block diagram of an embodiment of a computer system for implementing the encoding and decoding processes of FIGS. 6 and 7.

FIG. 8 is a block diagram of a computer system 800. The computer system 800 can be a stand alone computer system or part of a distributed processing system including multiple computer systems 800. The computer system 800 generally includes one or more processing units (CPUs) 812, one or more network or other communications interfaces 816, memory 818, and one or more communication buses 814 for interconnecting these components. The system 800 may optionally include a user interface, for instance a display and a keyboard. Memory 818 may include high speed random access memory and may also include non-volatile memory, such as one or more magnetic disk storage devices. Memory 818 may include mass storage that is remotely located from the central processing unit(s) 812.

The memory 818 stores an operating system 820 (e.g., Linux or Unix), a network communication module 822, an application 824, a variable-length data encoder 826, a variable-length data decoder 828, an offset table and mask table which may be combined into one table 830 or two separate tables, raw data to be encoded 832 (e.g., 32-bit unsigned integers), encoded data 834 (e.g., groups of four integers), a preprocessing module 836, a delta encoder 838 and a delta decoder 840. In some embodiments, the memory 818 stores only a subset of these items. For instance, in some embodiments, the system 800 decodes data, but does not encode data, and as a result the system 800 does not include the preprocessor 836, the encoder 826 and the delta encoder 838, and the "raw data" 832 comprises decoded data produced by decoding the encoded data 834. In an embodiment that encodes data, but does not decode data, the system 800 includes the preprocessor 836 and encoder 826, but does not include the variable-length data decoder 828, and lookup table(s) 830 and delta decoder 840.

An example of an application 824 is a document compression system used to generate a tokenspace repository, as described in co-pending U.S. patent application Ser. No. 10/917,739, filed Aug. 13, 2004, entitled "Document Compression System and Method For Use With Tokenspace Repository," which is incorporated by reference herein in its entirety.

The preprocessing module 836 and delta encoder/decoder 838 operate as previously described with respect FIGS. 1 and 2. The variable-length data encoder 826 and variable-length data decoder 828 operate as previously described with respect to FIGS. 6 and 7. The encoded data 834 can be stored in memory 818 using the data structures described with respect to FIGS. 3–5.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention various embodiments with various modifications as are suited to the particular use contemplated.

What is claimed is:

1. A data structure stored in a computer-readable medium, comprising:
    a tag field, occupying a contiguous space, the tag field for specifying storage lengths for N data values, where N is a positive integer greater than one; and
    N data fields contiguously arranged with the tag field for storing the N values, wherein each of the N data fields has a storage length specified by the tag field.

2. The data structure of claim 1, wherein the contiguous space occupied by the tag field has a size equal to an integer number of bytes.

3. The data structure of claim 1, wherein the tag includes N subfields, each specifying a respective length of a respective field of the N fields.

4. The data structure of claim 3, wherein a subfield of the N subfields represents a value equal to a length of a respective field minus one.

5. The data structure of claim 1, wherein N is equal to four; and
    the tag occupies only a single byte and includes four sub fields, each subfield specifying a respective length of a respective field of the four fields.

6. The data structure of claim 1, wherein each subfield specifies a respective length of one to four bytes.

7. The data structure of claim 1, wherein a single byte of the tag specifies lengths of a plurality of the N fields.

8. The data structure of claim 1, wherein the tag includes N subfields, each subfield representing a value equal to a length of a respective field minus one.

9. A data structure stored in a computer-readable medium, comprising:
    a contiguously stored set of fields, including:
        a tag, occupying a contiguous space, the tag specifying storage lengths for N values, where N is an integer greater than one; and
        N fields for storing the N values, wherein each of the N fields has a storage length specified by the tag.

10. The data structure of claim 9, wherein the tag is positioned at a beginning of the set of fields.

11. A method of decoding an encoded block of data, comprising:
    decoding a tag, occupying a contiguous space, so as to identify storage lengths for N fields of the encoded block of data, where N is an integer greater than one; and
    reading the N fields at positions in the encoded block of data determined in accordance with the tag;
    wherein the encoded block of data includes a contiguously stored set of fields, including the tag and the N fields.

12. The decoding method of claim 11, wherein decoding the tag includes performing a table lookup using the tag as an index.

13. The decoding method of claim 12, wherein performing the table lookup includes retrieving a plurality of offset values corresponding to relative positions of respective fields.

14. The decoding method of claim 12 wherein performing the table lookup includes retrieving an offset value corresponding to a relative position of a respective field.

15. The decoding method of claim 11 wherein decoding the tag includes inspecting individual subfields of the tag.

16. The decoding method of claim 11 wherein reading the N fields comprises performing an unaligned, full-width read followed by masking off extraneous bytes.

17. A method of encoding a block of data, comprising:
    generating a tag, occupying a contiguous space and comprising N subfields, each subfield specifying a respective length of a respective field of N fields in a set of fields; and
    storing the tag and the set of fields in a block of data including a contiguous set of storage locations, wherein each of the N fields has a length specified by a respective subfield of the N subfields.

18. The encoding method of claim 17 wherein generating the tag includes inspecting N values to determine N storage lengths for the N values and generating the N subfields of the tag so as to represent the N storage lengths.

19. The encoding method of claim 17 including storing the N fields at positions in the encoded block of data determined in accordance with the tag.

20. A system for decoding an encoded block of data, comprising:
    a processor;

memory coupled to the processor and storing software instructions including:

instructions to decode a tag, identifying storage lengths for N fields of the encoded block of data; and instructions to read the N fields at positions in the encoded block of data determined in accordance with the tag, wherein a tag occupies a contiguous space, N is an integer greater than one, and the encoded block of data includes a contiguously stored set of fields, including the tag and the N fields.

21. The decoding system of claim 20, wherein the instructions to decode the tag include instructions to perform a table lookup using the tag as an index.

22. The decoding system of claim 21, wherein the instructions to perform the table lookup includes instructions to retrieve a least one offset value corresponding to relative positions of respective fields.

23. The decoding system of claim 20, wherein the instructions to decode the tag include instructions to access individual subfields of the tag.

24. The decoding system of claim 20, wherein the instructions to read the N fields includes instructions to perform an unaligned, full-width read followed by masking off extraneous bytes.

25. A system for encoding a block of data, comprising:

a processor;

memory coupled to the processor and storing software instructions including:

instructions to generate a tag; and instructions to store the tag and a set of fields in a block of data including a contiguous set of storage locations, wherein the tag occupies a contiguous space, the tag comprises N subfields, each subfield specifies a respective length of a respective field of N fields in the set of fields, and each of the N fields has a length specified by a respective subfield of the N subfields.

26. The encoding system of claim 25, wherein the instructions to generate the tag include instructions to inspect N values to determine N storage lengths for the N values and instructions to generate the N subfields of the tag so as to represent the N storage lengths.

27. The encoding system of claim 25, including instructions to store the N fields at positions in the encoded block of data determined in accordance with the tag.

* * * * *

UNITED STATES PATENT AND TRADEMARK OFFICE
CERTIFICATE OF CORRECTION

PATENT NO. : 7,068,192 B2
APPLICATION NO. : 10/917745
DATED : June 27, 2006
INVENTOR(S) : Dean et al.

It is certified that error appears in the above-identified patent and that said Letters Patent is hereby corrected as shown below:

On the cover page, at (75) Inventors:

please delete "Gauthaum K. Thambidorai" and insert -- Gautham K. Thambidorai --.

Signed and Sealed this

Ninth Day of January, 2007

JON W. DUDAS
*Director of the United States Patent and Trademark Office*